(12) United States Patent
Lu et al.

(10) Patent No.: US 8,728,936 B1
(45) Date of Patent: May 20, 2014

(54) COPPER ETCHING INTEGRATION SCHEME

(71) Applicant: Taiwan Semiconductor Manufacturing Co., Ltd., Hsin-Chu (TW)

(72) Inventors: Chih-Wei Lu, Hsinchu (TW); Chung-Ju Lee, Hsinchu (TW); Hsiang-Huan Lee, Jhudong Township (TW); Tien-I Bao, Dayuan Township (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 13/676,260

(22) Filed: Nov. 14, 2012

(51) Int. Cl.
*H01L 21/44* (2006.01)

(52) U.S. Cl.
USPC .................................. 438/669; 257/E21.582

(58) Field of Classification Search
USPC .................................. 438/669, 672, 619, 421
See application file for complete search history.

(56) References Cited

U.S. PATENT DOCUMENTS

| 7,612,453 B2 * | 11/2009 | Usami | 257/758 |
| 2008/0124917 A1 * | 5/2008 | Oh et al. | 438/637 |

\* cited by examiner

*Primary Examiner* — Reema Patel
(74) *Attorney, Agent, or Firm* — Eschweiler & Associates, LLC

(57) ABSTRACT

The present disclosure is directed to a method of manufacturing an interconnect structure in which a sacrificial layer is formed over a semiconductor substrate followed by etching of the sacrificial layer to form a first feature. The metal layer is patterned and etched to form a second feature, followed by deposition of a low-k dielectric material. The method allows for formation of an interconnect structure without encountering the various problems presented by porous low-k dielectric damage.

18 Claims, 5 Drawing Sheets

COPPER ETCHING INTEGRATION SCHEME

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

DETAILED DESCRIPTION

Figure 1A:
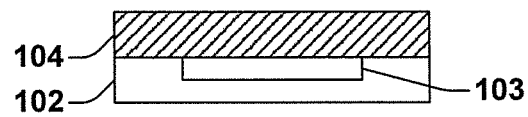
FIGS. 1A-1M are partial cross sectional views illustrating steps of one embodiment of forming an interconnect structure in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and etching steps can be performed to form a pattern of recessed areas in a dielectric layer, such as a low-k dielectric layer, on a semiconductor wafer that serve as trenches and vias for the interconnections. A deposition process may then be performed to deposit a metal layer over the semiconductor wafer thereby depositing metal both in the trenches and vias and also on the non-recessed areas of the semiconductor wafer. To isolate the interconnections, such as patterned trenches and vias, the metal deposited on the non-recessed areas of the semiconductor wafer is removed.

Increasingly, low-K layers are required to reduce signal delay and power loss effects as integrated circuit devices are scaled down. One way this has been accomplished has been to introduce porosity or dopants into the dielectric insulating layer.

As a result, the need for lower dielectric constant materials has resulted in the development of several different types of organic and inorganic low-k materials. In particular, incorporation of low-K materials with dielectric constants less than about 3.0 has become standard practice as semiconductor feature sizes have diminished to less than 0.13 microns. As feature sizes decrease below 0.13 microns, for example to 65 nm and below, materials with dielectric constants less than about 2.5 are required. Several different organic and inorganic low-k materials have been developed and proposed for use in semiconductor devices as insulating material having dielectric constants between about 2.2 and about 3.0.

Low-k dielectric materials, however, are susceptible to damage from the etching processes because they are softer, less chemically stable or more porous, or any combination of these factors. The plasma damage can manifest itself in higher leakage currents, lower breakdown voltages, and changes in the dielectric constant associated with the low-k dielectric material.

There is, therefore, a need in the integrated circuit manufacturing art to develop a manufacturing process whereby interconnect structures may be formed without encountering the various problems presented by porous low-K dielectric layers to improve integrated circuit device yield, performance, and reliability.

Accordingly, the present disclosure is directed to methods of fabrication of an interconnect structure. The methods provide a process for defining an interconnect structure that eliminates low-k dielectric damage caused during etching processes. The process provides the further advantage of eliminating the necessity for etch stop or NFARC (nitrogen-free anti-reflective coating) layers, making the process more cost effective.

FIGS. 1A-1M illustrate a plurality of partial cross section diagrams illustrating one embodiment of a method of forming an interconnect structure at stages in the manufacturing process according to the disclosure. Referring to FIG. 1A, a semiconductor substrate 102 having a conductive region 103 is provided. Substrate 102 is understood to include a semiconductor wafer or substrate, comprised of a semiconducting material such as silicon or germanium, or a silicon on insulator structure (SOI). Semiconductor structure can further include one or more conductive layers (such as metal or silicon) and/or insulating layers, and one or more active or passive devices formed in or over the substrate, or the like, for example, a display substrate such as a liquid crystal display (LCD), plasma display, electro-luminescence (EL) lamp display, or a light emitting diode (LED) substrate.

Overlying substrate 102 and covering conductive region 103 is a sacrificial layer 104. Sacrificial layer 104 comprises a homopolymer or copolymer. In one embodiment, sacrificial layer 104 comprises one or more of polyimide or P(neopentyl methacrylate-co-theylene glycol dimethacrylate copolymer (P(npMAco-EGDA). Sacrificial layer 104 is deposited by one or more of chemical vapor deposition (CVD) or spin-on coating processes. The thickness of the sacrificial layer will be in a range of from about 10000°A (angstroms) to about 100 A°.

Figure 1B:
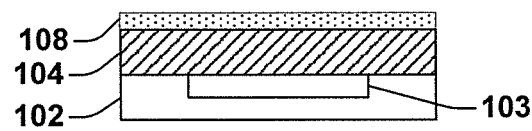

A dielectric hard mask layer 108 is then deposited 106 by, for example, a CVD process, as illustrated in FIG. 1B. The dielectric hard mask layer 108 is used to pattern the sacrificial layer 104 in a subsequent photolithographic process. In some embodiments, the dielectric hard mask layer 108 comprises a material such as silicon-oxide, silicon-nitride, silicon-oxynitride, and silicon-carbide. The dielectric hard mask layer 108 will have a thickness of from about 1000°A to about 10 A°.

Figure 1C:
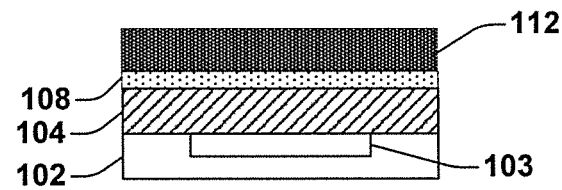
Figure 1D:
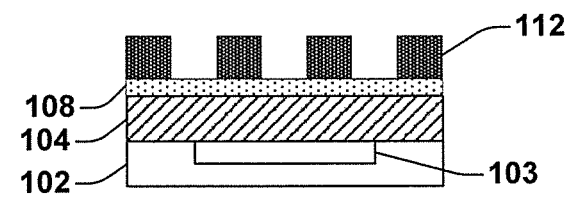

Following deposition of the hard mask layer 108, in one embodiment, a photoresist film 112 is formed by process 110 over the hard mask layer 108, as illustrated in FIG. 1C. Conventional photoresist materials may be used. The photoresist film 112 can be a carbon-containing, organic material. Various photoresists having various thicknesses can be utilized. Photo resist patterning and etching 114 are performed in FIG. 1D.

Figure 1E:
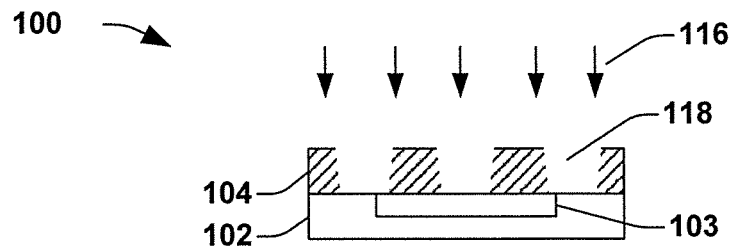

Hard mask 108 patterning and first etching process 116 through the hard mask layer 108 and into the sacrificial layer 104 are then performed to remove a portion of sacrificial layer 104 and form a first feature defined by an opening 118 in the sacrificial layer 104, as shown in FIG. 1E. In one embodiment, first feature comprises a trench.

Figure 1F:
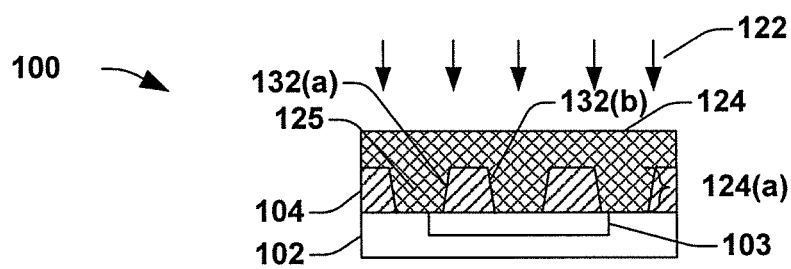

In FIG. 1F, a metal layer 124 is deposited 122 over first feature and filling opening 118 in sacrificial layer 104 to form a metal body 125 therein. Metal body 125 is defined by a lower portion 124(a) of the metal layer 124. Metal body includes angled opposing sidewalls. In one embodiment, the metal layer 124 can be formed from elements such as Al, W, Cu, CuMn, CuTi, CuCr or CuNb, and the like. Metal layer 124 can be formed using, for example, a plasma vapor deposition technique, among others. Metal layer 124 can be deposited at a thickness, in one embodiment, of from about 100A° (Angstroms) to about 20000A°.

Figure 1G:
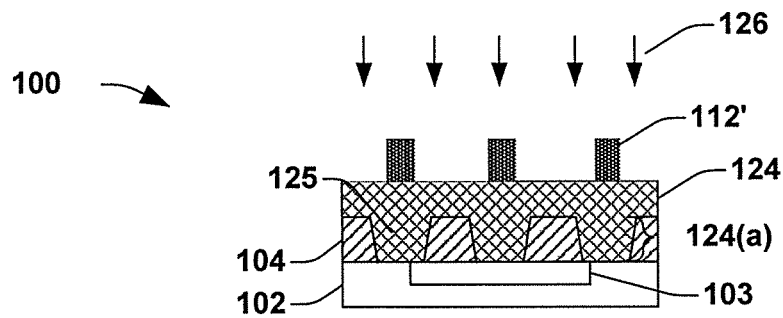
Figure 1H:
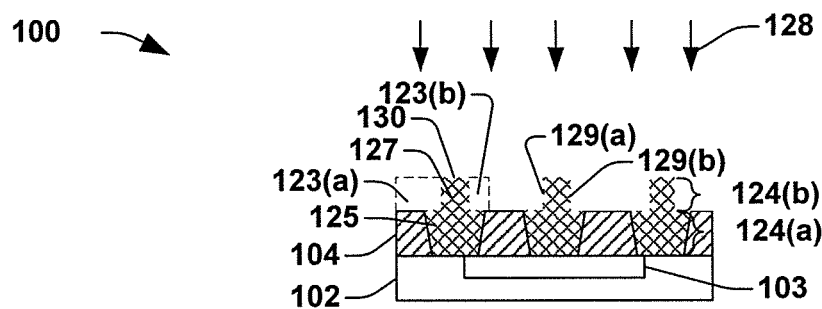

A photoresist film 112' is formed over the metal layer 124 and patterned 126 by conventional techniques, as shown in FIG. 1G. A second etch 128 is performed to pattern and etch an upper portion 124(b) of the metal layer 124 to form a second feature having first recesses 123(a), 123(b) and defined by a vertical projection 127 extending from the metal body 125, as illustrated in FIG. 1H. Vertical projection 127 includes opposing sidewalls 129(a), 129(b) and upper surface 130. In one embodiment, second feature comprises a via.

Figure 1I:
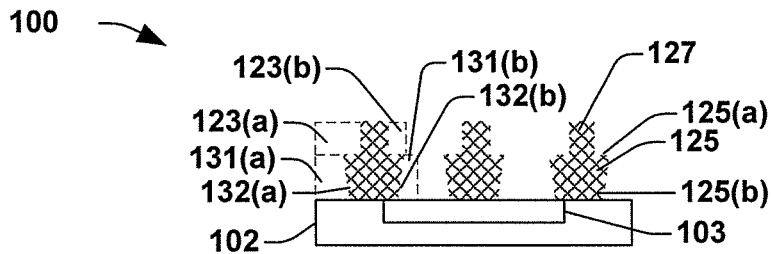
Figure 1J:
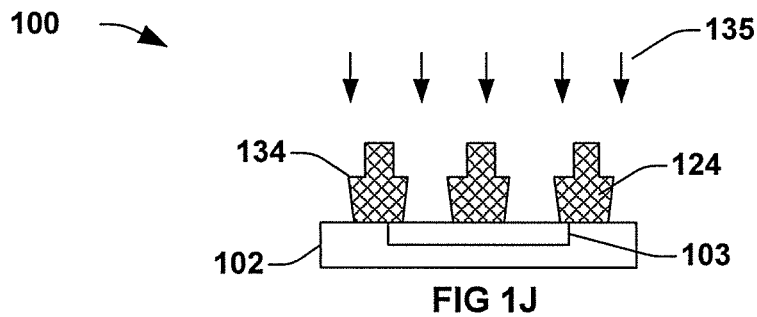

In FIG. 1I, sacrificial layer 104 is removed by one or more of, for example, etching, wet stripping, annealing, UV or IR radiation techniques (not shown). Removal of the sacrificial layer 104 exposes angled opposing sidewalls 132(a), 132(b) of metal body 125 and forms second recesses 131(a), 131(b). Angled opposing sidewalls 132(a), 132(b) taper such that metal body 125 has a wider top 125(a) and narrower bottom 125(b).

In one embodiment, a barrier layer 134 is formed overlying and encompassing metal body 125 and vertical projection 127 and disposed between dielectric material 136 (FIG. 1K) and metal layer 124. By encompassing metal body 125 and vertical projection 127, barrier layer 134 is continuous. Barrier layer 134 is formed by depositing a dielectric material, for example, silicon-nitride and silicon-carbide. In one embodiment, barrier layer 134 is formed by depositing a metal, for example, TiN, TaN, Co, WN, TiSiN, TaSiN, or combinations thereof. In another embodiment, an annealing 135 is performed at a temperature of about greater than 200° C., such that barrier layer 134 is self-forming, as illustrated FIG. 1J. The thickness of the barrier layer 134 can be, in one embodiment, from about 1A° (Angstrom) to about 300A°.

Figure 1K:
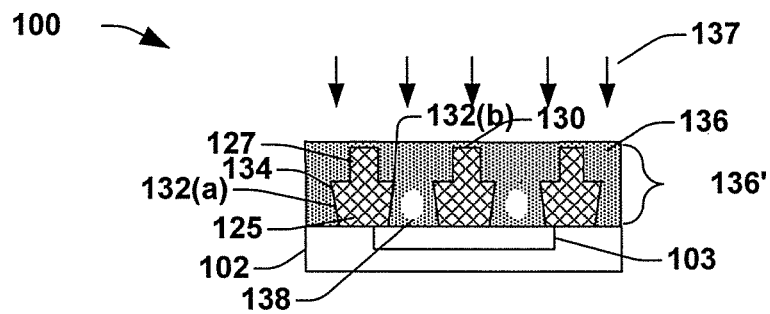

In FIG. 1K, low-k dielectric material 136 is deposited by process 137 to fill first 123(a), 123(b) and second 131(a), 131(b) recesses and overlying the upper surface 130 of the vertical projection 127 to form a dielectric region 136'. Low-k dielectric material 136 thus encapsulates vertical projection 127 and metal body 125. The low-k dielectric includes dielectrics with k less than about 3. Such dielectrics include, for example, carbon-doped silicon dioxide, also referred to as organosilicate glass (OSG) and carbon-oxide. Low-k materials may also include borophosphosilicate glass (BPSG), borosilicate glass (BSG), and phosphosilicate glass (PSG), among others. The dielectric layer 134 may be formed using, for example, tetraethyl orthosilicate (TEOS), chemical vapor deposition (CVD), plasma enhanced CVD (PECVD), low pressure CVD (LPCVD), or spin-on coating techniques. The thickness of the low-k dielectric will be, in one embodiment, from about 100A° to about 20000A°.

Figure 1L:
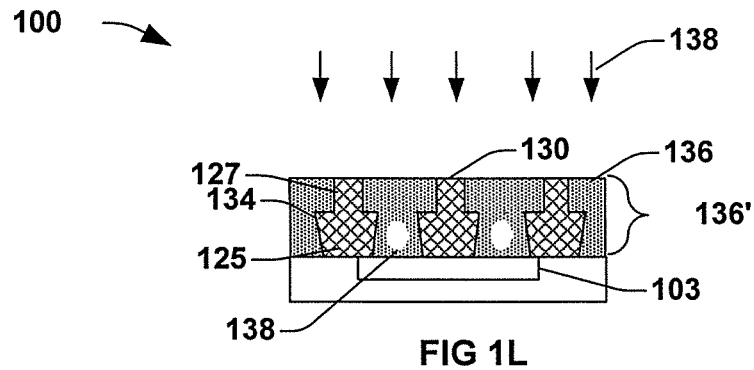

In the embodiment illustrated in FIG. 1K, at least one air gap 138 is formed within the dielectric material 136. The air gap 138 is disposed in the dielectric region 136' between angled sidewalls 132(a), 132(b) of adjacent metal bodies 125. Air gap 138 can be self-forming during deposition of the low-k material 136. In one embodiment, the size of the air gap can be from about 0A° to about 20000A°. It is contemplated, however, that the size of the air gap can be controlled by the low-k material 136 deposition process. A chemical mechanical polishing (CMP) process 138 can then be performed to remove excess dielectric layer 136 and expose upper surface 130 of vertical projection 127, as illustrated in FIG. 1L.

Figure 1M:
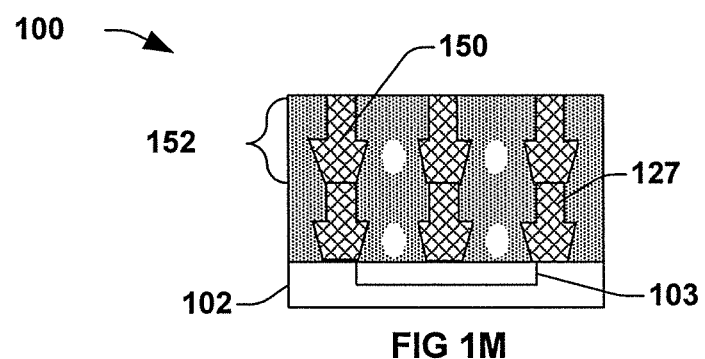

Following CMP process, the method can be repeated to form an additional metal layer 150 of an interconnect structure 152 overlying via and electrically coupled to the via, as illustrated in FIG. 1M, so as to form an integrated circuit 100' of at least two adjacent interconnect structures.

Figure 2:
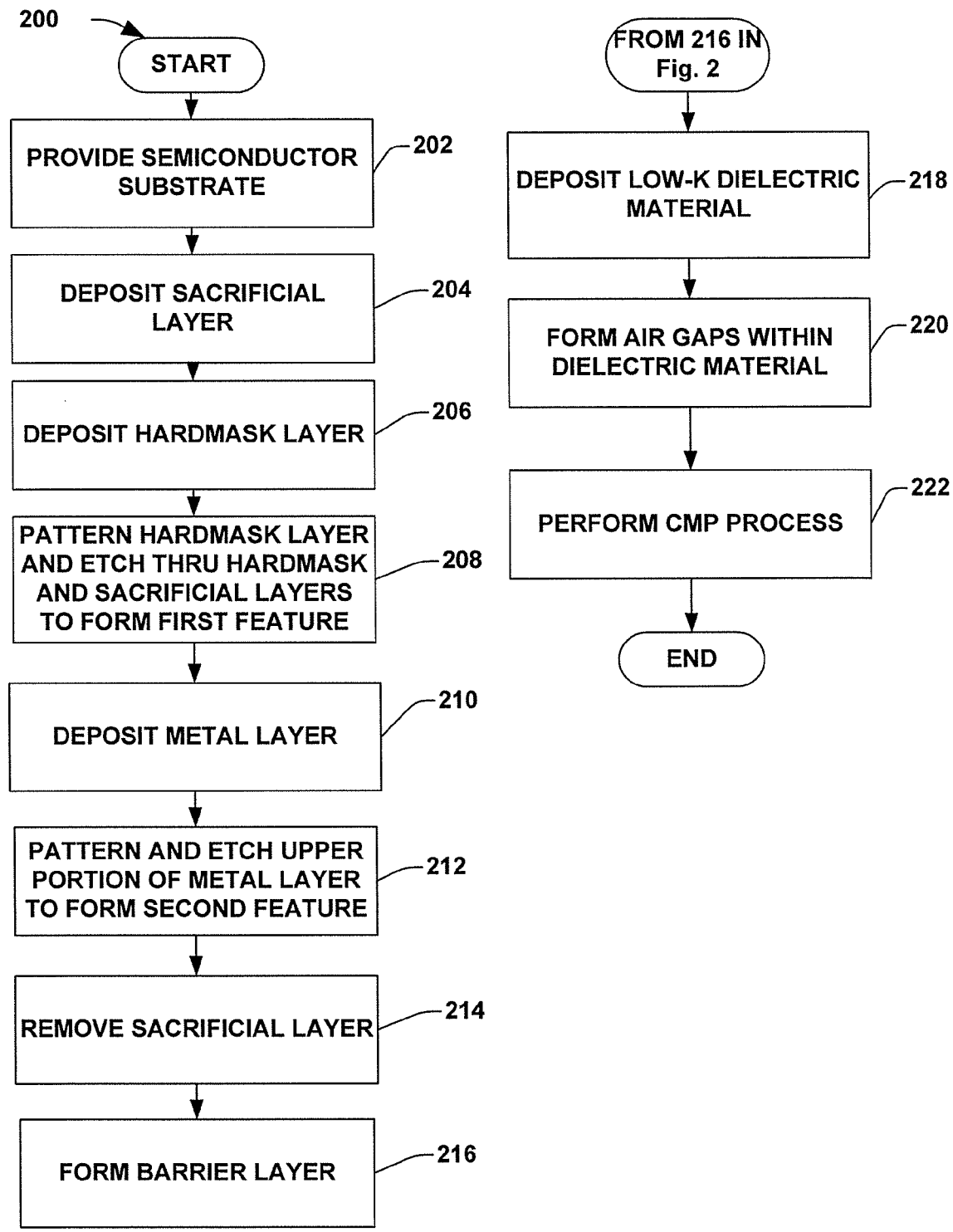
FIG. 2 illustrates a flow diagram of some embodiments of a method for the fabrication of an interconnect structure in accordance with the disclosure.

FIG. 2 illustrates a flow diagram of some embodiments of a method 200 for formation of a semiconductor structure according to an embodiment of the invention. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 202 a semiconductor substrate is provided. A sacrificial layer is then formed over the substrate at step 204.

At step 206, a hard mask layer is deposited overlying the sacrificial layer.

At step 208, a first feature is formed by patterning and etching through hard mask and sacrificial layer to form an opening in the sacrificial layer.

At step 210, a metal layer is deposited overlying first feature and filling the feature opening.

At step 212, an upper portion of the metal layer is patterned and etched to form a second feature.

At step 214, sacrificial layer is removed.

At step 216, a barrier layer is formed by CVD, PVD, MOCVD or ALD, or barrier layer can be self-formed by annealing.

At step 218, a low-k dielectric material is deposited to fill recesses and encompass metal body and vertical projection.

At step 220, at least one air gap is formed in the low-k dielectric material. The air gap is disposed in the dielectric region between adjacent interconnect structures.

At step 222, a CMP process is performed to remove excess dielectric layer and expose a top surface of the vertical projection. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to method for forming an interconnect structure comprising depositing a hard mask layer overlying the sacrificial layer. The method further comprises patterning the hard mask layer and the sacrificial layer to form a first feature defined by an opening in the sacrificial layer. The method further includes depositing a metal layer overlying the first feature and filling the opening to form a metal body therein, the metal body defined by a lower portion of the metal layer. The method further includes patterning and etching an upper portion of the metal layer to form a second feature having first recesses in an upper portion of the metal layer and defined by a vertical projection extending from the metal body. The method further includes removing the sacrificial layer to expose opposing sidewalls of the metal body and form second recesses about opposing sidewalls, and then depositing a low-k dielectric material overlying an upper surface of vertical projection and filling first and second recesses.

The disclosure further relates to a method for forming a copper interconnect structure comprising providing a semiconductor substrate having a conductive region and forming a sacrificial layer overlying the substrate. The method further comprises forming a dielectric hard mask layer over the sacrificial layer. The method further comprises performing a first etching by etching the hard mask layer and the sacrificial layer to form a first feature opening in the sacrificial layer. The method further includes depositing forming a metal layer overlying the sacrificial layer and filling the feature opening. The method further includes performing asecond etching by etching the metal layer to form a second feature and removing the sacrificial layer. The method further includes depositing a low-k dielectric material overlying the first and second features and forming at least one air gap within the low-k dielectric material.

The disclosure further relates to an integrated circuit comprising at least two adjacent interconnect structures. The interconnect structures include a metal body having angled opposing sidewalls and a metal vertical projection extending from the metal body. The integrated circuit further comprises a low-k dielectric material is disposed overlying and between adjacent interconnect structures. The circuit further includes a barrier layer between the dielectric material and the interconnect structure.

What is claimed is:

1. An method for forming an interconnect structure, comprising:
   depositing a sacrificial layer overlying a semiconductor substrate having a conductive region and covering the conductive region;
   depositing a hard mask layer overlying the sacrificial layer;
   patterning the hard mask layer and etching through the hard mask layer and the sacrificial layer to form a first feature defined by an opening in the sacrificial layer;
   depositing a metal layer overlying the first feature and filling the opening to form a metal body therein, the metal body defined by a lower portion of the metal layer;
   patterning and etching an upper portion of the metal layer to form a second feature having first recesses in an upper portion of the metal layer and defined by a vertical projection extending from the metal body;
   removing the sacrificial layer to expose opposing sidewalls of the metal body and form second recesses about opposing sidewalls;
   depositing a low-k dielectric material overlying an upper surface of the vertical projection and filling first and second recesses; and
   removing excess dielectric layer and exposing an upper surface of the vertical projection.

2. The interconnect structure of claim 1, wherein the metal layer comprises Al, W, Cu, CuMn, CuTi, CuV, CuCr or CuNb.

3. The interconnect structure of claim 1, further comprising forming a barrier layer overlying and encompassing metal body and vertical projection.

4. The interconnect structure of claim 1, wherein the first feature comprises a trench and the second feature comprises a via.

5. The interconnect structure of claim 2, wherein the metal body includes angled opposing sidewalls which taper to form a metal body having a wider top and a narrower bottom.

6. The interconnect structure of claim 2, wherein the sacrificial layer comprises polyimide or P(neopentyl methacrylate-co-ethylene glycol dimethacryalte).

7. The interconnect structure of claim 3, wherein the barrier layer is formed by annealing at a temperature of greater than 200° C.

8. The interconnect structure of claim 2, further comprising forming an additional metal layer overlying the via and electrically coupled to the via.

9. The interconnect structure of claim 6, wherein the hard mask layer is a dielectric hard mask layer comprising a nitride, a carbide, or an oxide.

10. The interconnect structure of claim 1, further comprising forming at least one air gap within the low-k dielectric material and between angled sidewalls of adjacent metal bodies.

11. A method for forming a copper interconnect structure, comprising:
    providing a semiconductor substrate;
    forming a sacrificial layer over the semiconductor substrate;
    forming a dielectric hard mask layer over the sacrificial layer;
    performing a first etching by etching the hard mask layer and the sacrificial layer to form a first feature opening in the sacrificial layer;
    forming a metal layer overlying the sacrificial layer and filling the feature opening;
    performing a second etching by etching of the metal layer to form a second feature, wherein the second feature comprises a vertical metal projection having recesses on either side, the second feature extending from and overlaying a metal body, and wherein the metal body is wider than the vertical metal projection;
    removing the sacrificial layer;
    depositing a low-k dielectric material overlying the first and second features;
    forming at least one air gap within the low-k dielectric material; and
    removing excess dielectric layer.

12. The method of claim 11, wherein the air gap is self-forming.

13. The method of claim 11, wherein the low-k dielectric material has a dielectric constant of less than about 3.

14. The method of claim 13, further comprising forming a barrier layer between the first and second features and the low-k dielectric material and the barrier layer is continuous.

15. The method of claim 14, wherein the metal layer comprises Al, W, Cu, CuMn, CuTi, CuV, CuCr or CuNb.

16. The method of claim 11, wherein the vertical metal projection comprises opposing sidewalls and an upper surface.

17. The method of claim 11, wherein the metal body comprises angled opposing sidewalls, a top surface and a bottom surface, wherein the top surface is wider than the bottom surface.

18. The method of claim 11, wherein removing the sacrificial layer comprises etching, wet stripping, annealing or UV/IR radiation techniques.

* * * * *